United States Patent
Nakagawa et al.

(10) Patent No.: US 7,724,047 B2
(45) Date of Patent: May 25, 2010

(54) SEMICONDUCTOR INTEGRATED CIRCUIT DRIVING EXTERNAL FET AND POWER SUPPLY INCORPORATING THE SAME

(75) Inventors: Eiji Nakagawa, Kyoto (JP); Koji Miyamoto, Kyoto (JP); Akira Aoki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 128 days.

(21) Appl. No.: 11/951,692

(22) Filed: Dec. 6, 2007

(65) Prior Publication Data

US 2008/0136466 A1    Jun. 12, 2008

(30) Foreign Application Priority Data

Dec. 6, 2006 (JP) ............................. 2006-329378

(51) Int. Cl.
  *H03B 1/10* (2006.01)
  *H03K 3/00* (2006.01)
(52) U.S. Cl. ..................................... 327/112
(58) Field of Classification Search ................. 327/108, 327/110, 112
See application file for complete search history.

(56) References Cited

U.S. PATENT DOCUMENTS 5,410,262 A * 4/1995 Kang ........................ 327/108
2006/0164867 A1* 7/2006 Dikken et al. ................. 363/13

FOREIGN PATENT DOCUMENTS

| JP | 2000-201475 | 7/2000 |
| JP | 2003-235251 | 8/2003 |
| JP | 2004-088245 | 3/2004 |

* cited by examiner

*Primary Examiner*—Quan Tra
(74) *Attorney, Agent, or Firm*—Fish & Richardson P.C.

(57) ABSTRACT

A semiconductor integrated circuit includes: a switching control circuit having a first transistor and a second transistor coupled to an FET, and turning on and off the FET by turning on and off each of the first transistor and the second transistor, the FET attaining an OFF state when the first transistor is in an ON state and the second transistor is in an OFF state; a bias circuit supplying the FET with a bias voltage for turning off the FET when the first transistor and the second transistor are in an OFF state; and a protection control circuit turning off the FET by turning on the first transistor and turning off the second transistor when an abnormality is detected, and turning off the first transistor and the second transistor after a lapse of a predetermined time.

3 Claims, 3 Drawing Sheets

US 7,724,047 B2

SEMICONDUCTOR INTEGRATED CIRCUIT DRIVING EXTERNAL FET AND POWER SUPPLY INCORPORATING THE SAME

BACKGROUND OF THE INVENTION

1. Field of the Invention

The present invention relates to a semiconductor integrated circuit and a power supply, and in particular to a semiconductor integrated circuit driving an external FET and a power supply incorporating the same.

2. Description of the Background Art

FET driving circuits for driving an external FET (Field Effect Transistor) have been developed. For example, a driving circuit controlling switching of a transistor is disclosed in Japanese Patent Laying-Open Nos. 2000-201475, 2004-088245, and 2003-235251 (Patent Documents 1-3).

Such a conventional driving circuit as described above is provided with a switching control circuit switching an external FET between an ON state and an OFF state. As the switching control circuit, for example, a circuit formed by combining an N-channel MOS (Metal Oxide Semiconductor) transistor with a P-channel MOS transistor is employed.

When an FET driving IC (Integrated Circuit) in which FET driving circuits are integrated has an abnormality such as a short circuit of an external terminal, there may be a case where control is performed to turn off an external FET by turning on one of the N-channel MOS transistor and the P-channel MOS transistor in the switching control circuit and turning off the other thereof, in order to prevent a large current from flowing into the external FET and breaking down the external FET or a circuit at the next stage of the external FET.

However, when a short circuit occurs between a ground potential, a power supply potential, or the like and an external terminal to which an output of the switching control circuit is connected, although the external FET can be turned off, a large current may flow into the MOS transistor in an ON state in the switching control circuit, and break down the MOS transistor.

To solve such a problem, there can be conceived a structure that turns off both of the N-channel MOS transistor and the P-channel MOS transistor in the switching control circuit when an abnormality occurs, and includes a pull-down resistor or a pull-up resistor supplying a gate of the external FET with a bias voltage turning off the external FET. In such a structure, however, due to a parasitic capacitance of the external FET and the pull-up resistor or the pull-down resistor generally having a value of several tens of kilo-ohms, a longer time is required to cause transition of a potential at the gate of the external FET from a potential corresponding to the ON state to a potential corresponding to the OFF state, which may break down the external FET or the circuit at the next stage of the external FET.

SUMMARY OF THE INVENTION

One object of the present invention is provide a semiconductor integrated circuit and a power supply capable of protecting both of an external FET and a circuit driving the external FET.

A semiconductor integrated circuit in accordance with an aspect of the present invention is a semiconductor integrated circuit driving an external FET, including: a switching control circuit having a first transistor and a second transistor coupled to the FET, and turning on and off the FET by turning on and off each of the first transistor and the second transistor, the FET attaining an OFF state when the first transistor is in an ON state and the second transistor is in an OFF state; a bias circuit supplying the FET with a bias voltage for turning off the FET when the first transistor and the second transistor are in an OFF state; and a protection control circuit turning off the FET by turning on the first transistor and turning off the second transistor when an abnormality is detected, and turning off the first transistor and the second transistor after a lapse of a predetermined time.

Preferably, the first transistor has a first conductive electrode coupled to a first fixed potential and a second conductive electrode coupled to a control electrode of the FET, the second transistor has a first conductive electrode coupled to the control electrode of the FET and a second conductive electrode coupled to a second fixed potential, the bias circuit includes a resistor having a first end coupled to the first fixed potential and a second end coupled to the control electrode of the FET, and the FET is turned off when the control electrode has a potential equal to the first fixed potential.

A power supply in accordance with an aspect of the present invention includes an FET and a semiconductor integrated circuit. The semiconductor integrated circuit includes a switching control circuit having a first transistor and a second transistor coupled to the FET, and turning on and off the FET by turning on and off each of the first transistor and the second transistor, and the FET attains an OFF state when the first transistor is in an ON state and the second transistor is in an OFF state. The semiconductor integrated circuit further includes a bias circuit supplying the FET with a bias voltage for turning off the FET when the first transistor and the second transistor are in an OFF state, and a protection control circuit turning off the FET by turning on the first transistor and turning off the second transistor when an abnormality is detected, and turning off the first transistor and the second transistor after a lapse of a predetermined time.

According to the present invention, both of an external FET and a circuit driving the external FET can be protected.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
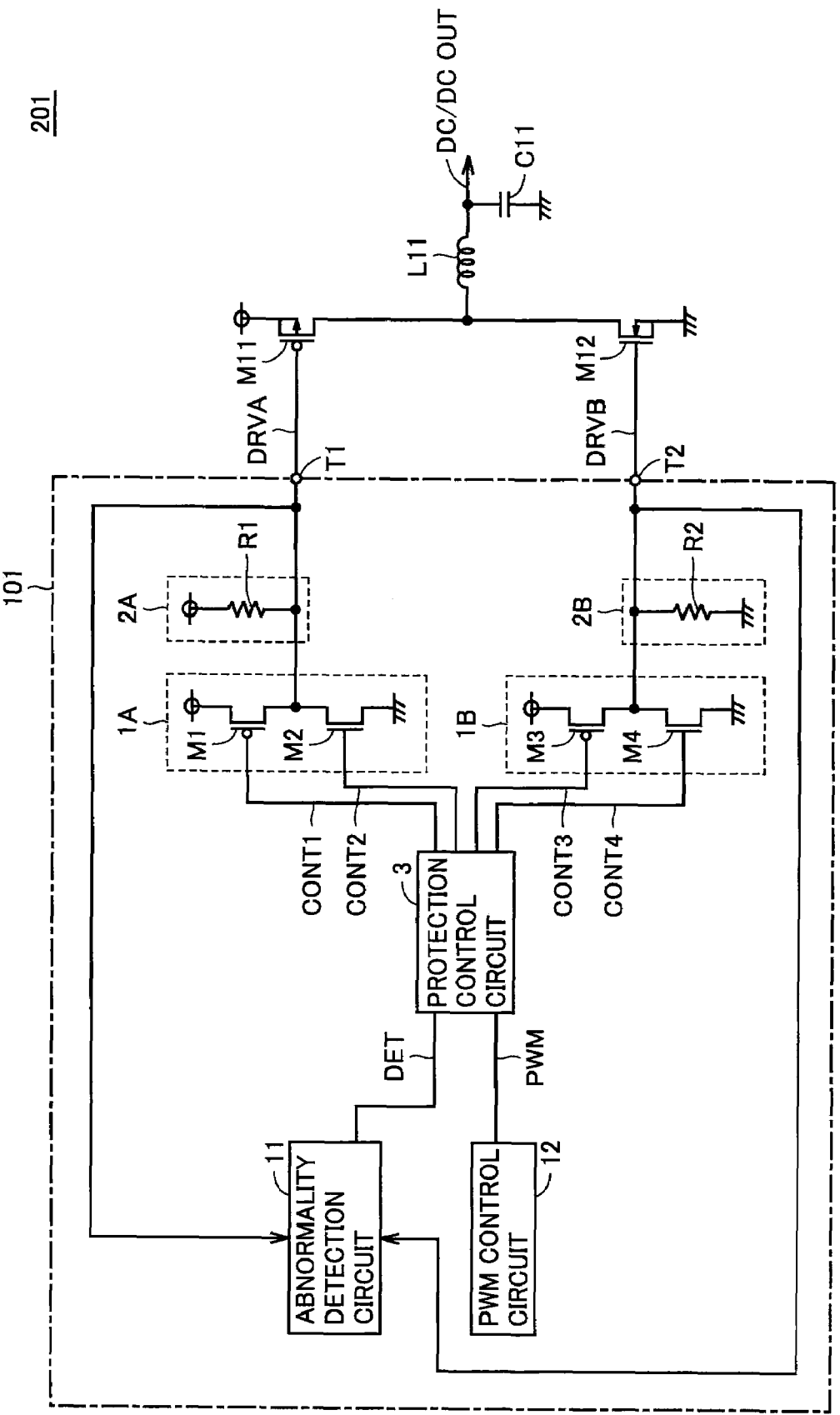
FIG. 1 shows a structure of a power supply in accordance with an embodiment of the present invention.

Hereinafter, embodiments of the present invention will be described with reference to the drawings, in which identical or corresponding parts will be designated by the same reference numerals, and the description thereof will not be repeated.

FIG. 1 shows a structure of a power supply in accordance with an embodiment of the present invention.

Referring to FIG. 1, a power supply 201 includes a semiconductor integrated circuit 101, a P-channel MOS transistor M11, an N-channel MOS transistor M12, a coil L11, and a capacitor C11. Semiconductor integrated circuit 101 includes switching control circuits 1A and 1B, bias circuits 2A and 2B, a protection control circuit 3, an abnormality detection circuit 11, a PWM (Pulse Width Modulation) control circuit 12, and external terminals T1 and T2. Switching control circuit 1A includes a P-channel MOS transistor (first transistor) M1 and an N-channel MOS transistor (second transistor) M2. Switching control circuit 1B includes a P-channel MOS transistor (second transistor) M3 and an N-channel MOS transistor (first transistor) M4. Bias circuit 2A includes a resistor R1, and bias circuit 2B includes a resistor R2.

P-channel MOS transistor M1 has a source (first conductive electrode) coupled to a power supply potential (first fixed potential). N-channel MOS transistor M2 has a drain (first conductive electrode) coupled to a drain (second conductive electrode) of P-channel MOS transistor M1, and a source (second conductive electrode) coupled to a ground potential (second fixed potential). Resistor R1 has a first end coupled to the power supply potential, and a second end coupled to the drain of P-channel MOS transistor M1 and the drain of N-channel MOS transistor M2.

P-channel MOS transistor M11 has a gate (control electrode) coupled to the drain of P-channel MOS transistor M1 and the drain of N-channel MOS transistor M2, via external terminal T1.

When P-channel MOS transistor M1 is in an ON state and N-channel MOS transistor M2 is in an OFF state, P-channel MOS transistor M11 has a gate potential equal to the power supply potential, and attains an OFF state. Further, when P-channel MOS transistor M1 is in an OFF state and N-channel MOS transistor M2 is in an ON state, P-channel MOS transistor M11 has a gate potential equal to the ground potential, and attains an ON state.

When P-channel MOS transistor M1 or N-channel MOS transistor M2 is in the ON state, bias circuit 2A has no effect on the gate potential of P-channel MOS transistor M11. When P-channel MOS transistor M1 and N-channel MOS transistor M2 are in the OFF state, bias circuit 2A supplies the gate of P-channel MOS transistor M11 with a bias voltage for turning off P-channel MOS transistor M11, that is, a power supply voltage.

P-channel MOS transistor M3 has a source (first conductive electrode) coupled to the power supply potential (first fixed potential). N-channel MOS transistor M4 has a drain (first conductive electrode) coupled to a drain (second conductive electrode) of P-channel MOS transistor M3, and a source (second conductive electrode) coupled to the ground potential (second fixed potential). Resistor R2 has a first end coupled to the ground potential, and a second end coupled to the drain of P-channel MOS transistor M3 and the drain of N-channel MOS transistor M4.

N-channel MOS transistor M12 has a gate (control electrode) coupled to the drain of P-channel MOS transistor M3 and the drain of N-channel MOS transistor M4, via external terminal T2.

When P-channel MOS transistor M3 is in an ON state and N-channel MOS transistor M4 is in an OFF state, N-channel MOS transistor M12 has a gate potential equal to the power supply potential, and attains an ON state. Further, when P-channel MOS transistor M3 is in an OFF state and N-channel MOS transistor M4 is in an ON state, N-channel MOS transistor M12 has a gate potential equal to the ground potential, and attains an OFF state.

When P-channel MOS transistor M3 or N-channel MOS transistor M4 is in the ON state, bias circuit 2B has no effect on the gate potential of N-channel MOS transistor M12. When P-channel MOS transistor M3 and N-channel MOS transistor M4 are in the OFF state, bias circuit 2B supplies the gate of N-channel MOS transistor M12 with a bias voltage for turning off N-channel MOS transistor M12, that is, a ground voltage.

PWM (Pulse Width Modulation) control circuit 12 outputs to protection control circuit 3 a PWM signal for exclusively switching P-channel MOS transistor M11 and N-channel MOS transistor M12 between the ON state and the OFF state.

Protection control circuit 3 generates control signals CONT1-CONT4 according to the PWM signal received from PWM control circuit 12, and outputs control signals CONT1-CONT4 to P-channel MOS transistor M1 and N-channel MOS transistor M2 in switching control circuit 1A and P-channel MOS transistor M3 and N-channel MOS transistor M4 in switching control circuit 1B, respectively.

According to control signals CONT1-CONT4 received from protection control circuit 3, switching control circuits 1A and 1B switch P-channel MOS transistor M11 and N-channel MOS transistor M12, respectively, between the ON state and the OFF state.

An alternating-current voltage generated by the switching of each of P-channel MOS transistor M11 and N-channel MOS transistor M12 between the ON state and the OFF state is smoothed by coil L11 and capacitor C11, and output to the outside as a power supply voltage.

Abnormality detection circuit 11 monitors output voltages of semiconductor integrated circuit 101, that is, voltages at external terminals T1 and T2. When abnormality detection circuit 11 determines that an abnormality occurs in the output voltage of semiconductor integrated circuit 101, it outputs an abnormality detection signal DET to protection control circuit 3.

Upon receiving abnormality detection signal DET from abnormality detection circuit 11, protection control circuit 3 turns on P-channel MOS transistor M1 and turns off N-channel MOS transistor M2 irrespective of the PWM signal received from PWM control circuit 12, and thereby turns off P-channel MOS transistor M11. Further, upon receiving abnormality detection signal DET from abnormality detection circuit 11, protection control circuit 3 turns off P-channel MOS transistor M3 and turns on N-channel MOS transistor M4 irrespective of the PWM signal received from PWM control circuit 12, and thereby turns off N-channel MOS transistor M12.

After a lapse of a predetermined time, protection control circuit 3 turns off P-channel MOS transistors M1 and M3 and N-channel MOS transistors M2 and M4.

Figure 2:
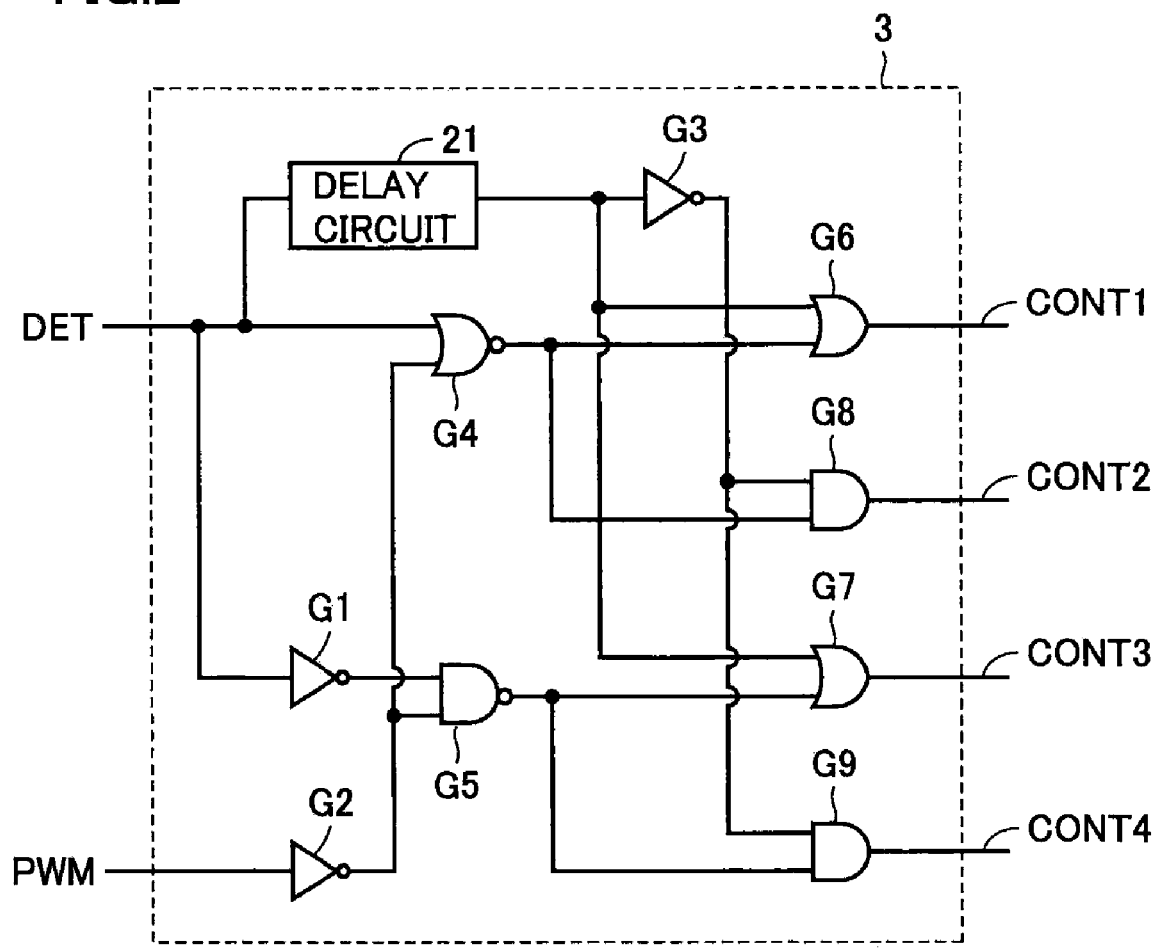
FIG. 2 shows a structure of a protection control circuit in a semiconductor integrated circuit incorporated into the power supply in accordance with the embodiment of the present invention.

FIG. 2 shows a structure of the protection control circuit in the semiconductor integrated circuit incorporated into the power supply in accordance with the embodiment of the present invention.

Referring to FIG. 2, protection control circuit 3 includes NOT circuits G1-G3, a NOR circuit G4, a NAND circuit G5, OR circuits G6 and G7, AND circuits G8 and G9, and a delay circuit 21.

NOT circuit G1, NOR circuit G4, and delay circuit 21 receive abnormality detection signal DET from abnormality detection circuit 11. NOT circuit G2 receives the PWM signal from PWM control circuit 12.

Delay circuit 21 delays abnormality detection signal DET for a predetermined time, and outputs the delayed signal to NOT circuit G3 and to OR circuits G6 and G7. Delay circuit 21 can be formed of, for example, an analog circuit including a capacitor and a resistor, or a digital circuit including a counter.

OR circuit G6 outputs control signal CONT1 to a gate of P-channel MOS transistor M1. AND circuit G8 outputs control signal CONT2 to a gate of N-channel MOS transistor M2.

OR circuit G7 outputs control signal CONT3 to a gate of P-channel MOS transistors M3. AND circuit G9 outputs control signal CONT4 to a gate of N-channel MOS transistor M4.

Figure 3:
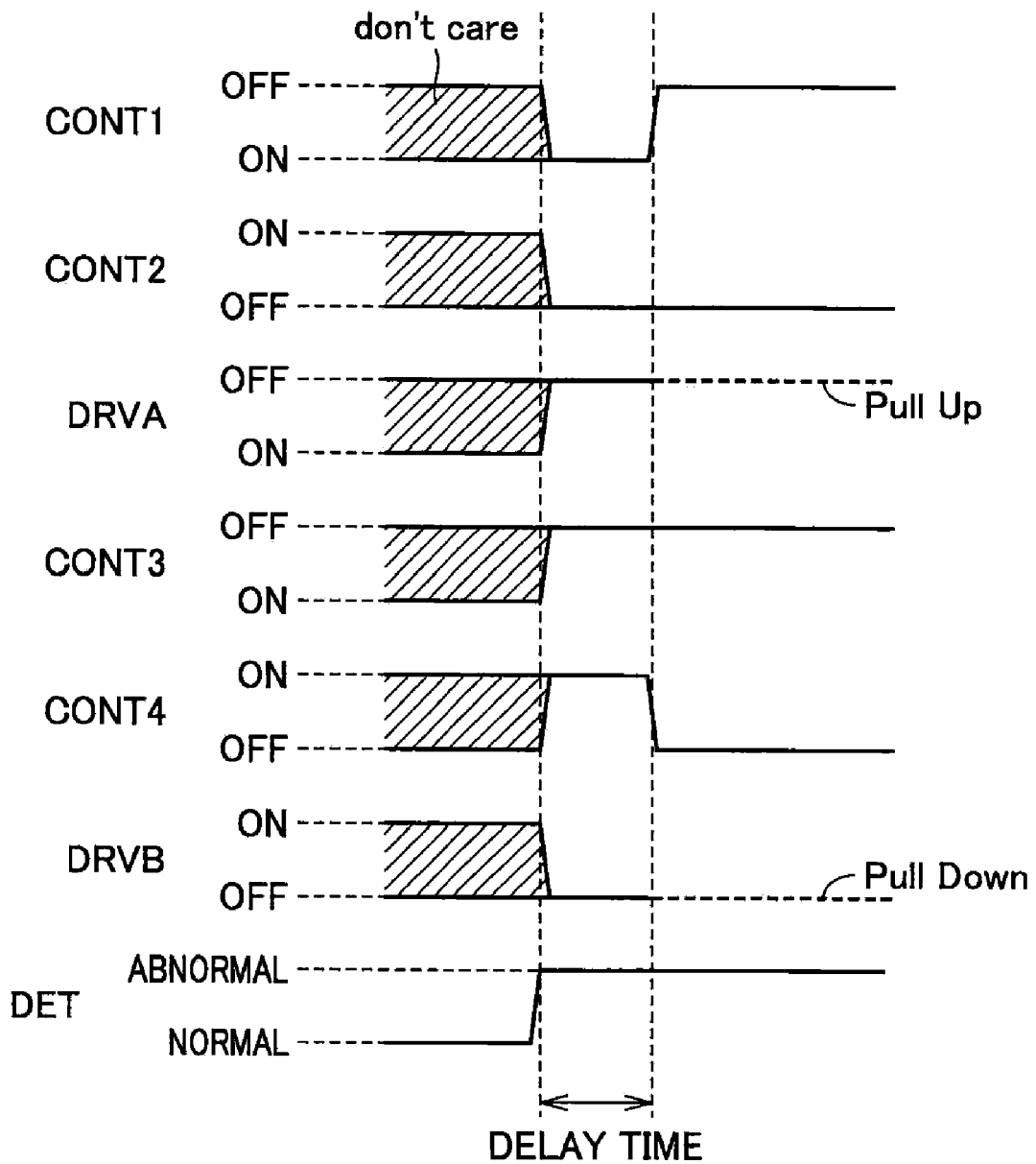
FIG. 3 is a timing chart showing operation of a protection control circuit 3.

FIG. 3 is a timing chart showing operation of protection control circuit 3. Herein, it is assumed that abnormality detection circuit 11 does not detect an abnormality when abnormality detection signal DET is at an L level, and abnormality detection circuit 11 detects an abnormality when abnormality detection signal DET is at an H level.

Referring to FIG. 3, when abnormality detection signal DET is at the L level, protection control circuit 3 determines logic levels of control signals CONT1 -CONT4 according to the PWM signal.

During a period from when abnormality detection signal DET changes from the L level to the H level until when a predetermined delay time elapses, protection control circuit 3 sets control signal CONT1 to an L level, control signal CONT2 to an L level, control signal CONT3 to an H level, and control signal CONT4 to an H level. Specifically, protection control circuit 3 turns on P-channel MOS transistor M1 and turns off N-channel MOS transistor M2, thereby setting a drive signal DRVA to an H level and turning off P-channel MOS transistor M11. Further, protection control circuit 3 turns off P-channel MOS transistor M3 and turns on N-channel MOS transistor M4, thereby setting a drive signal DRVB to an L level and turning off N-channel MOS transistor M12.

After the predetermined delay time elapses, protection control circuit 3 sets control signal CONT1 to an H level, control signal CONT2 to the L level, control signal CONT3 to the H level, and control signal CONT4 to an L level. Specifically, protection control circuit 3 turns off P-channel MOS transistors M1 and M3 and N-channel MOS transistors M2 and M4. On this occasion, bias circuit 2A maintains drive signal DRVA at the H level, that is, maintains P-channel MOS transistor M11 in the OFF state, by means of resistor R1 pulled up to the power supply potential. Further, bias circuit 2B maintains drive signal DRVB at the L level, that is, maintains N-channel MOS transistor M12 in the OFF state, by means of resistor R2 pulled down to the ground voltage.

Protection control circuit 3 performs control as shown in FIG. 3 not only when abnormality detection circuit 11 detects an abnormality but also when power supply 201 is stopped during normal operation. Thereby, semiconductor integrated circuit 101 can be configured with a simpler structure.

In a conventional FET driving IC, when a short circuit occurs between a ground potential, a power supply potential, or the like and an external terminal to which an output of a switching control circuit switching an external FET between an ON state and an OFF state is connected, although the external FET can be turned off, a large current may flow into a MOS transistor in an ON state in the switching control circuit, and break down the MOS transistor. Or else, due to a parasitic capacitance of the external FET and a pull-up resistor or a pull-down resistor generally having a value of several tens of kilo-ohms, a longer time is required to cause transition of a potential at a gate of the external FET from a potential corresponding to the ON state to a potential corresponding to the OFF state, which may break down the external FET or a circuit at the next stage of the external FET.

However, in the semiconductor integrated circuit in accordance with the embodiment of the present invention, when an abnormality is detected, protection control circuit 3 turns off an external FET by turning on one of the MOS transistors in the switching control circuit and turning off the other MOS transistor, and after a lapse of a predetermined time, protection control circuit 3 turns off the two MOS transistors. Subsequently, the bias circuit supplies the external FET with a bias voltage for turning off the external FET.

Consequently, the semiconductor integrated circuit in accordance with the embodiment of the present invention can quickly turn off the external FET when an abnormality occurs to reliably protect the external FET and a circuit at the next stage of the external FET, and can protect a circuit such as a transistor in the semiconductor integrated circuit for driving the external FET.

Although the power supply in accordance with the embodiment of the present invention is described to include P-channel MOS transistor M11 and N-channel MOS transistor M12 as the FETs external to semiconductor integrated circuit 101, the power supply is not limited thereto. Not only a MOS transistor but also an FET of any other type may be used. Further, power supply 201 may be formed to include two P-channel MOS transistors or two N-channel MOS transistors as the FETs external to semiconductor integrated circuit 101.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor integrated circuit arranged to drive an external FET, the semiconductor integrated circuit comprising:
    an external terminal;
    a switching control circuit including a first transistor and a second transistor coupled to said FET via the external terminal, and arranged to turn on and off said FET by turning on and off each of said first transistor and said second transistor, said FET attaining an OFF state when said first transistor is in an ON state and said second transistor is in an OFF state;
    a bias circuit arranged to supply said FET with a bias voltage via the external terminal for turning off said FET when said first transistor and said second transistor are in an OFF state;
    an abnormality detection circuit arranged to monitor the external terminal, to determine whether an abnormality has occurred and to provide an abnormality detection signal if it is determined that an abnormality has occurred; and
    a protection control circuit arranged to turn off said FET by turning on said first transistor and turning off said second transistor in response to receiving the abnormality detection signal, and turning off said first transistor and said second transistor after a lapse of a predetermined time.

2. The semiconductor integrated circuit according to claim 1, wherein
    said first transistor has a first conductive electrode coupled to a first fixed potential and a second conductive electrode coupled to a control electrode of said FET,
    said second transistor has a first conductive electrode coupled to the control electrode of said FET and a second conductive electrode coupled to a second fixed potential,
    said bias circuit includes a resistor having a first end coupled to said first fixed potential and a second end coupled to the control electrode of said FET, and
    said FET is turned off when said control electrode has a potential equal to said first fixed potential.

3. A power supply comprising:

an FET; and a semiconductor integrated circuit, wherein said semiconductor integrated circuit includes:

a switching control circuit having a first transistor and a second transistor coupled to said FET, and arranged to turn on and off said FET via the external terminal by turning on and off each of said first transistor and said second transistor, said FET attaining an OFF state when said first transistor is in an ON state and said second transistor is in an OFF state, a bias circuit arranged to supply said FET with a bias voltage via the external terminal for turning off said FET when said first transistor and said second transistor are in an OFF state, an abnormality detection circuit arranged to monitor the external terminal, to determine whether an abnormality has occurred and to provide an abnormality detection signal if it is determined that an abnormality has occurred; and a protection control circuit arranged to turn off said FET by turning on said first transistor and turning off said second transistor in response to receiving the abnormality detection signal, and turning off said first transistor and said second transistor after a lapse of a predetermined time.

* * * * *